(12) United States Patent
Tang

(10) Patent No.: US 8,625,277 B2
(45) Date of Patent: Jan. 7, 2014

(54) FIXING DEVICE FOR FIXING FANS AND COOLING SYSTEM HAVING SAME

(75) Inventor: Xian-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 215 days.

(21) Appl. No.: 13/347,090

(22) Filed: Jan. 10, 2012

(65) Prior Publication Data

US 2013/0083480 A1 Apr. 4, 2013

(30) Foreign Application Priority Data

Sep. 30, 2011 (CN) .......................... 2011 1 0296636

(51) Int. Cl.
*H05K 7/20* (2006.01)
*F04D 29/60* (2006.01)

(52) U.S. Cl.
USPC ................ 361/695; 361/679.47; 361/679.48; 361/692; 361/694; 361/715; 361/719; 165/80.3; 165/104.33; 165/121; 165/122; 248/223.41; 248/694; 416/246; 417/423.14; 454/184

(58) Field of Classification Search
USPC ............... 361/679.46–679.54, 690–697, 715, 361/719–727; 165/80.3, 80.4, 104.33, 165/121–126; 454/184; 415/208, 208.1, 415/177.1, 178, 182.1, 208.2, 208.3; 416/223 R, 246; 417/423.13, 423.14
See application file for complete search history.

(56) References Cited

U.S. PATENT DOCUMENTS

| | | | | |
|---|---|---|---|---|
| 4,931,904 A * | 6/1990 | Yiu | ................................. | 361/695 |
| 5,287,009 A * | 2/1994 | Heung | ........................... | 307/141 |
| 5,854,738 A * | 12/1998 | Bowler | ........................... | 361/695 |
| 6,002,586 A * | 12/1999 | Chen et al. | ..................... | 361/695 |
| 6,322,042 B1 * | 11/2001 | Nemec | ............................ | 248/694 |
| 6,411,511 B1 * | 6/2002 | Chen | ................................ | 361/697 |
| 6,775,139 B2 * | 8/2004 | Hsueh | ............................. | 361/697 |
| 7,002,796 B2 * | 2/2006 | Lao et al. | ....................... | 361/695 |
| 7,821,788 B2 * | 10/2010 | Hsiao | .............................. | 361/695 |
| 8,064,199 B2 * | 11/2011 | Lin | .................................. | 361/695 |
| 8,351,205 B2 * | 1/2013 | Tang et al. | ...................... | 361/695 |

* cited by examiner

Primary Examiner — Michail V Datskovskiy
(74) Attorney, Agent, or Firm — Altis Law Group, Inc.

(57) ABSTRACT

A cooling system includes a fixing device and a fan. The fixing device includes a fixing rack and a latching rack. The fixing rack includes a first latching arm and two opposite supporting arms protruding from two ends of the first latching arm. The latching rack includes a second latching arm and two opposite adjusting arms protruding from two ends of the second latching arm. The adjusting arms can be adjustably fixed to the supporting arms at different positions to adjust a distance between the first latching arms and the second latching arm to releasably fix the fan between the first latching arm and the second latching arm.

16 Claims, 4 Drawing Sheets

FIXING DEVICE FOR FIXING FANS AND COOLING SYSTEM HAVING SAME

BACKGROUND

1. Technical Field

The disclosure generally relates to fixing devices for cooling systems, particularly to a cooling system of a peripheral component interconnect (PCI) of a computer.

2. Description of Related Art

In an electronic device, such as a computer, there are many peripheral component interconnects which generate heat when the electronic device operates. In designing an electronic device, cooling systems are used to dissipate heat generated by the peripheral component interconnects to prevent the peripheral component interconnects from failure from overheating. However, typical cooling system can not always efficiently cool all the peripheral component interconnects.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary fixing device and cooling system having the fixing device. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
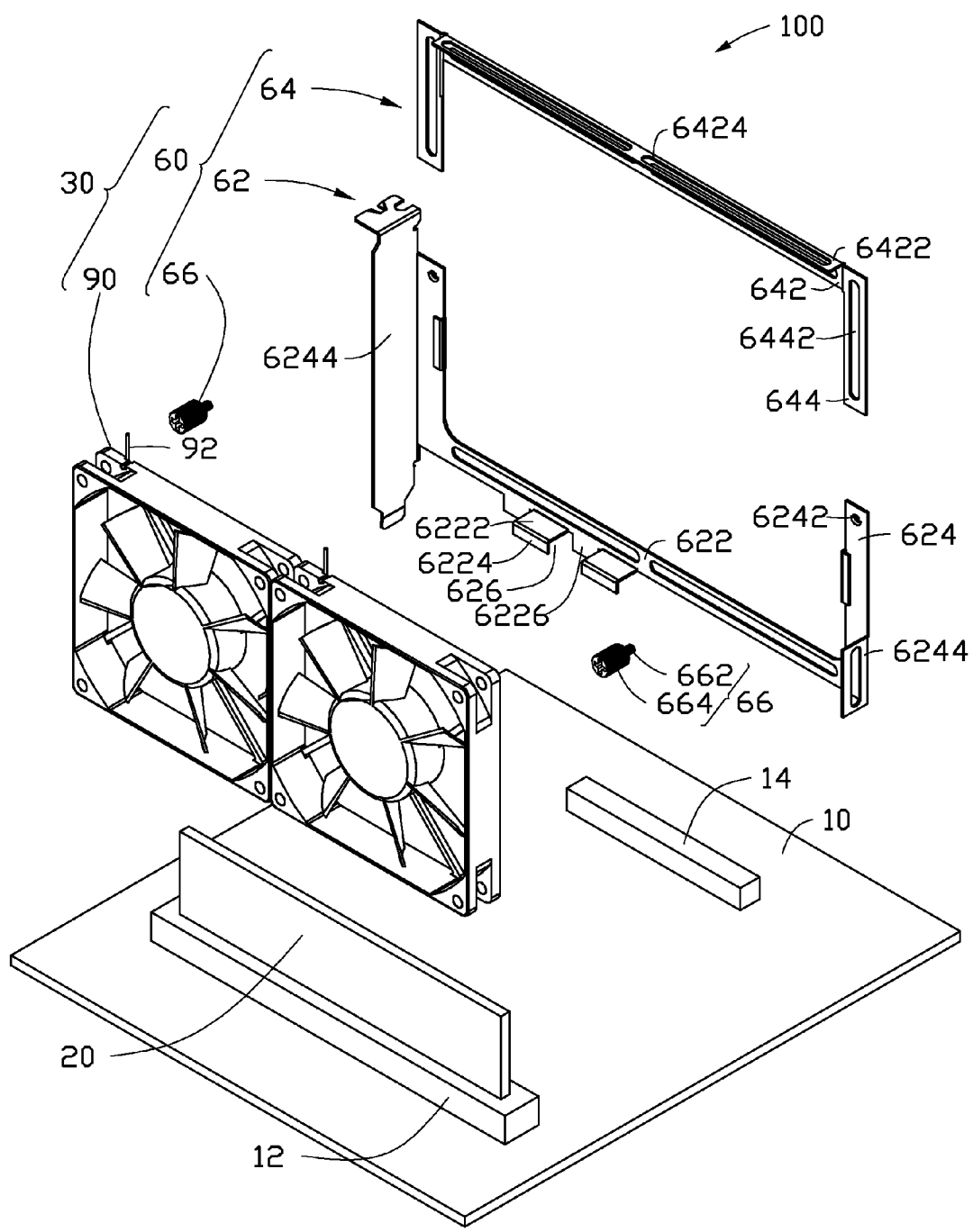
FIG. 1 is an exploded view of an embodiment of a cooling system used in an electronic device.

Referring to FIG. 1, an electronic device 100, such as a computer, includes a main board 10, a peripheral component interconnect 20 (PCI), and a cooling system 30. The main board 10 includes an interface 12 and a latching rib 14 opposite to the interface 12. The PCI 20 is latched in the interface 12 and the cooling system 30 is secured on the latching rib 14 so the PCI 20 and the cooling system 30 are oppositely fixed on the main board 10.

The cooling system 30 includes a fixing device 60 and two fans 90. The fixing device 60 includes a fixing rack 62, a latching rack 64 adjustably fixed to the fixing rack 62, and two fasteners 66 fixing the latching rack 64 to the fixing rack 62. The fans 90 are secured between the fixing rack 62 and the latching rack 64. The number of the fans 90 may be varied according to different use conditions.

The fixing rack 62 includes a first latching arm 622 and two opposite supporting arms 624. Each supporting arm 624 protrudes from one of ends of the first latching arms 622. The latching rack 64 includes a second latching arm 642 and two adjusting arms 644. Each adjusting arm 644 protrudes from one of the ends of the second latching arm 642.

Two first latching boards 6222 protrude from the first latching arm 622, a second latching board 6422 protrudes from the second latching arm 642 opposite to the first latching boards 6222. The fans 90 are latched between the first latching boards 6222 and the second latching board 6422.

Each first latching board 6222 has a first latching plate 6224 protruding from its distal end. Two second latching plates 6226 protrudes from the first latching arm 622. The first latching plates 6224 and the second latching plates 6226 cooperatively form a latching groove 626, in which the latching rib 14 is latched to fix the fixing rack 62 to the main board 10.

The second latching board 6422 defines two positioning holes 6424 in the longitudinal direction from one of the adjusting arms 644 to the other adjusting arm 644. Each fan 90 has a positioning pin 92 located in one of the positioning holes 6424 to position the fans 90 to the second latching board 6422.

Each supporting arm 624 defines a retaining hole 6242, in which one of the fasteners 66 is fixed. Each adjusting arm 644 defines a sliding hole 6442 in its longitudinal direction. Each fastener 66 passes through one of the sliding holes 6442, and then fixed in corresponding retaining hole 6242, to fix the latching rack 64 to the fixing rack 62.

Each supporting arm 624 further includes a sidewall 6244 protruding from one of its surfaces facing the first latching boards 6222. The sidewalls 6244 are opposite.

Each fastener 66 includes a fastening portion 662 and a head 664 protruding the fastening portion 662. Each fastening portion 662 passes through one of the sliding holes 6442 and be fastened in one of the retaining hole 6242. When the fastening portions 662 are fully fastened in the retaining holes 6242, the heads 664 and the supporting arms 624 cooperatively fix the adjusting arms 644 to the fixing rack 62.

Figure 2:
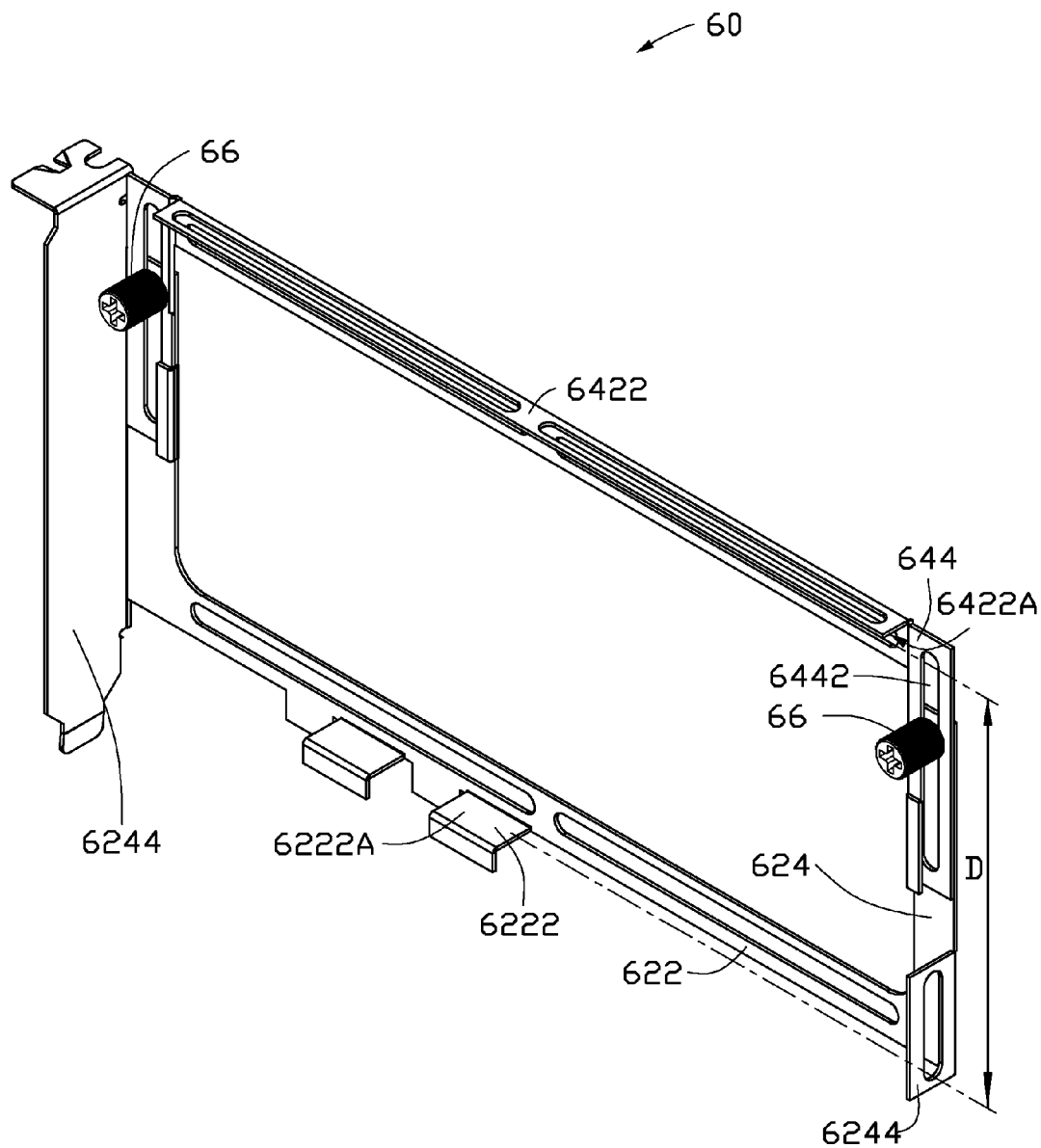
FIG. 2 is a schematic view of an assembled fixing device of the cooling system in FIG. 1 in a first position.
Figure 3:
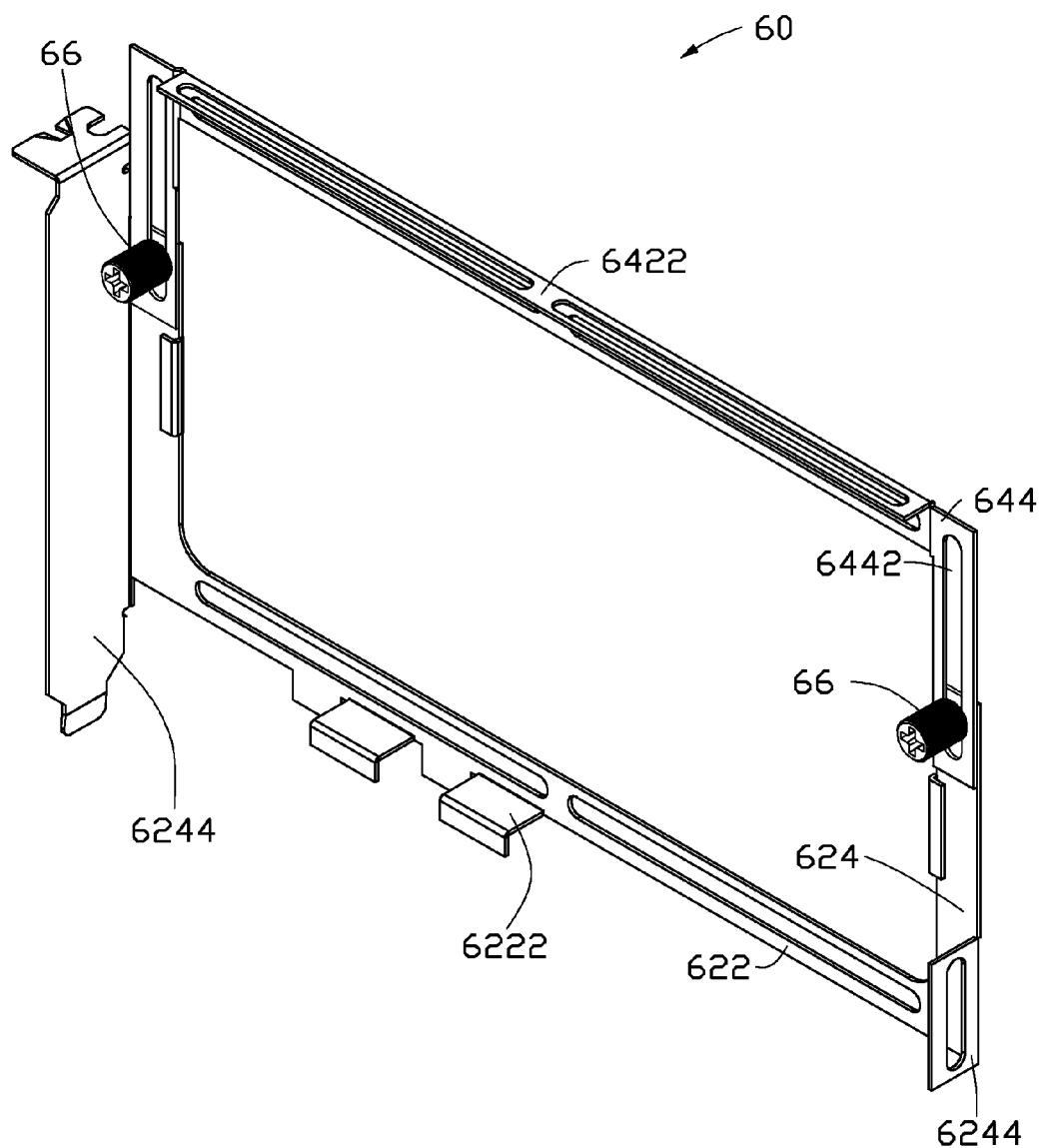
FIG. 3 is a schematic view of the fixing device of FIG. 2 in a second position.
Figure 4:
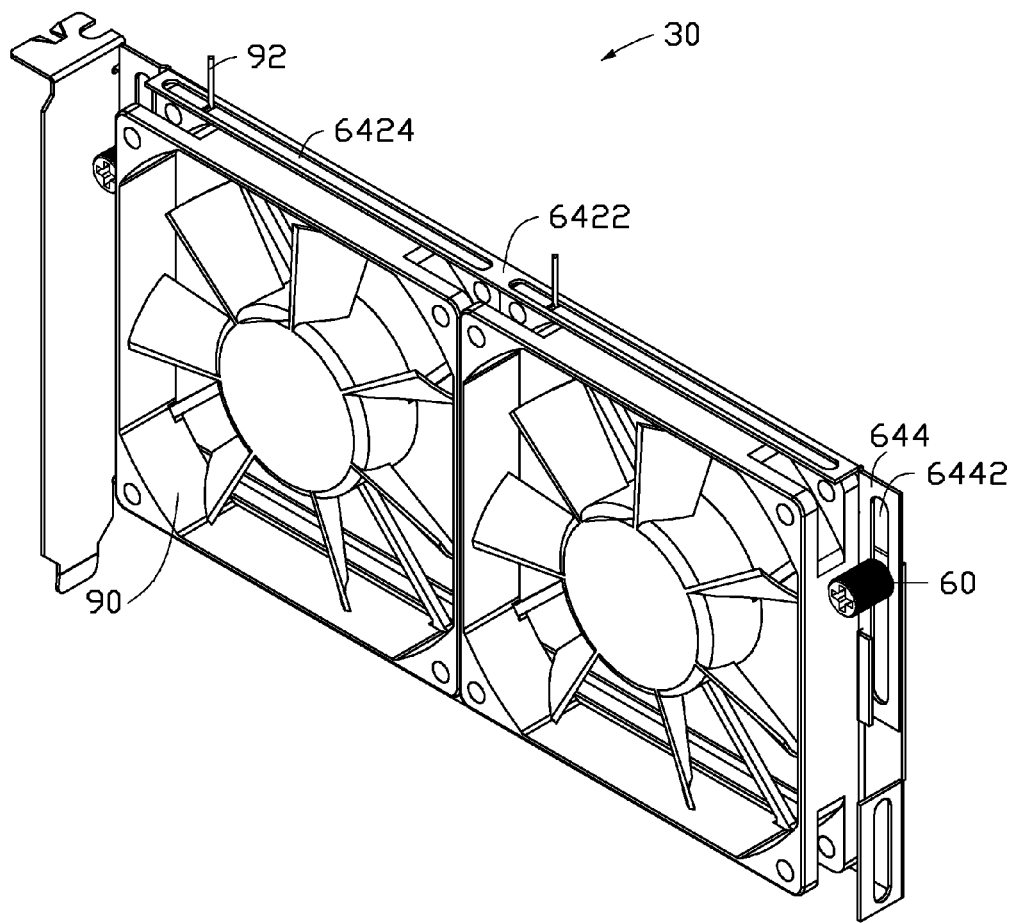
FIG. 4 is a schematic view of an assembled cooling system in FIG. 1.

Referring to FIGS. 2-4, to assemble a cooling system 30, the sliding holes 6442 are aligned with the retaining holes 6242, the fasteners 66 pass through the sliding holes 6442 and are partially fastened in the retaining holes 6242. At this time, the latching rack 64 is capable of sliding relative to the fixing rack 62 as the fastening portions 662 slide in the sliding holes 6442 so a distance D (FIG. 2) between an upper surface 6222A of the first latching boards 6222 and a lower surface 6422A of the second latching board 6422 can be adjusted. The distance D between the first latching boards 6222 and the second latching board 6422 is adjusted to adapt the dimension of the fans 90. The fans 90 are placed between the first latching boards 6222 and the second latching board 6422 with the positioning pins 92 located in the positioning holes 6424. Causing the latching rack 64 to move toward the fixing rack 62 until the fans 90 are tightly latched between the first latching boards 6222 and the second latching board 6422. The fasteners 66 are fully fastened (tightened) in the retaining holes 6242 so the heads 664 and supporting arms 624 cooperatively fix the adjusting arms 644 to the fixing rack 62, and an assembled cooling system 30 is yielded.

Referring to FIGS. 2-4, to remove the fans 90 from the fixing device 40, the fasteners are loosened from the retaining holes 6242, allowing the latching rack 64 to move away the fixing rack 62 until the fans 90 are released so the fans 90 can be removed from the fixing device 40.

To assemble an electronic device 100, the latching rib 14 is latched in the latching groove 626 to fix the cooling system 30 to the main board 10. The PCI 20 is inserted into the interface 12 to fix the PCI 20 to the main board 10 so an assembled electronic device 100 is yielded.

In above exemplary embodiment, the fans 90 are opposite to the PCI 20 so the heat generated by the PCI 20 can be efficiently dissipated by the airflow of the fans 90, to cool and protect the PCI 20. Additionally, the distance D between the fixing rack 62 and the latching rack 64 can be adjusted so different fans 90 having different sizes and powers can be latched between the fixing rack 62 and the latching rack 64 by adjusting the distance between the fixing rack 62 and the latching rack 64, to satisfy cooling requirements at different conditions.

It is to be understood, however, that even through numerous characteristics and advantages of the disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A cooling system, comprising:
    a fixing device including a fixing rack and a latching rack, the fixing rack including a first latching arm and two opposite supporting arms protruding from two ends of the first latching arm, the latching rack including a second latching arm and two opposite adjusting arms protruding from two ends of the second latching arm; and
    a fan;
    wherein the adjusting arms can be adjustably fixed to the supporting arms at different positions to adjust a distance between the first latching arms and the second latching arm to releasably fix the fan between the first latching arm and the second latching arm.

2. The cooling system as claimed in claim 1, wherein the fixing device further includes two fasteners, each adjusting arm defines a sliding hole, each supporting arm defining a retaining hole; the fastener pass through the sliding holes and the retaining holes to slidably fix the adjusting arms to the supporting arms.

3. The cooling system as claimed in claim 1, wherein two first latching boards protrude from the first latching arm, a second latching board protrudes from the second latching arm opposite to the first latching boards; the fan is latched between the first latching boards and the second latching board.

4. The cooling system as claimed in claim 3, wherein the second latching board defines a positioning hole in the longitudinal direction from one of the adjusting arms to the other adjusting arm, the fan has a positioning pin located in one of the positioning holes to position the fan to the second latching board.

5. The cooling system as claimed in claim 2, wherein each fastener includes a fastening portion and a head protruding the fastening portion; each fastening portion passes through one of the sliding holes and be fastened in one of the retaining hole; the heads and the supporting arms cooperatively fix the adjusting arms to the fixing rack.

6. An electronic device, comprising:
    a main board;
    a PCI mounted to the main board; and
    a cooling system mounted to the main board opposite to the PCI, the cooling system comprising:
        a fixing device including a fixing rack and a latching rack, the fixing rack including a first latching arm and two opposite supporting arms protruding from two ends of the first latching arm, the latching rack including a second latching arm and two opposite adjusting arms protruding from two ends of the second latching arm; and
        a fan;
        wherein the adjusting arms can be adjustably fixed to the supporting arms at different positions to adjust a distance between the first latching arms and the second latching arm to releasably fix the fan between the first latching arm and the second latching arm.

7. The electronic device as claimed in claim 6, wherein the fixing device further includes two fasteners, each adjusting arm defines a sliding hole, each supporting arm defining a retaining hole; the fastener pass through the sliding holes and the retaining holes to fix the adjusting arms to the supporting arms.

8. The electronic device as claimed in claim 6, wherein two first latching boards protrude from the first latching arm, a second latching board protrudes from the second latching arm opposite to the first latching boards; the fan is latched between the first latching boards and the second latching board.

9. The electronic device as claimed in claim 8, wherein the main board includes a latching rib; each first latching board has a first latching plate protruding from its distal end, two second latching plates protrudes from the first latching arm, the first latching plates and the second latching plates cooperatively form a latching groove, in which the latching rib is latched to fix the fixing rack to the main board.

10. The electronic device as claimed in claim 8, wherein the second latching board defines a positioning hole in the longitudinal direction from one of the adjusting arms to the other adjusting arm, the fan has a positioning pin located in one of the positioning holes to position the fan to the second latching board.

11. The electronic device as claimed in claim 7, wherein each fastener includes a fastening portion and a head protruding the fastening portion; each fastening portion passes through one of the sliding holes and be fastened in one of the retaining hole; the heads and the supporting arms cooperatively fix the adjusting arms to the fixing rack.

12. A cooling system, comprising:
    a fixing device including a fixing rack and a latching rack, the fixing rack including a first latching arm and two opposite supporting arms protruding from two ends of the first latching arm, the latching rack including a second latching arm and two opposite adjusting arms protruding from two ends of the second latching arm; and
    a fan;
    two fasteners, the fasteners rotatably fixed to the supporting arms to releasably fixing the adjusting arms to the supporting arms:
    wherein when the fasteners are tightened to the supporting arms, the adjusting arms are fixed to the supporting arms to fix the fan between the first latching arms and the second latching arm; when the fasteners are loosened from the supporting arms, the adjusting arms are capable of sliding relative to the supporting arms to adjust a distance between the first latching arm and the second latching arm.

13. The electronic device as claimed in claim 12, wherein each adjusting arm defines a sliding hole, each supporting arm defining a retaining hole; the fastener pass through the sliding holes and the retaining holes to fix the adjusting arms to the supporting arms.

14. The cooling system as claimed in claim 12, wherein two first latching boards protrude from the first latching arm, a second latching board protrudes from the second latching arm opposite to the first latching boards; the fan is latched between the first latching boards and the second latching board.

15. The cooling system as claimed in claim 14, wherein the second latching board defines a positioning hole in the longitudinal direction from one of the adjusting arms to the other adjusting arm, the fan has a positioning pin located in one of the positioning holes to position the fan to the second latching board.

16. The cooling system as claimed in claim 13, wherein each fastener includes a fastening portion and a head protruding the fastening portion; each fastening portion passes through one of the sliding holes and be fastened in one of the retaining hole; the heads and the supporting arms cooperatively fix the adjusting arms to the fixing rack.

* * * * *